United States Patent
Van Veldhoven

(10) Patent No.: US 7,605,731 B2
(45) Date of Patent: Oct. 20, 2009

(54) SIGNAL PROCESSOR WITH A SIGNAL STRENGTH DETECTION CIRCUIT THAT IS COUPLED TO A LOOP OF AN ANALOG TO DIGITAL CONVERTER

(75) Inventor: Robert Henrikus Margaretha Van Veldhoven, Dommelen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/577,500

(22) PCT Filed: Oct. 11, 2005

(86) PCT No.: PCT/IB2005/053342
§ 371 (c)(1),
(2), (4) Date: Jan. 3, 2008

(87) PCT Pub. No.: WO2006/043206
PCT Pub. Date: Apr. 27, 2006

(65) Prior Publication Data
US 2008/0117087 A1    May 22, 2008

(30) Foreign Application Priority Data
Oct. 18, 2004    (EP) .................................. 04300684

(51) Int. Cl.
*H03M 1/62*    (2006.01)
*H03M 1/84*    (2006.01)
(52) U.S. Cl. ........................ 341/139; 341/155
(58) Field of Classification Search ............... 341/143, 341/155, 139, 120, 118
See application file for complete search history.

(56) References Cited

U.S. PATENT DOCUMENTS

| | | | |
|---|---|---|---|
| 5,012,244 A | 4/1991 | Wellard et al. | |
| 5,107,225 A | 4/1992 | Wheatley, III et al. | |
| 5,243,345 A * | 9/1993 | Naus et al. ................... | 341/143 |
| 5,940,441 A * | 8/1999 | Cranford et al. ............ | 375/232 |
| 6,324,228 B1 * | 11/2001 | Millward et al. ............ | 375/344 |
| 6,459,397 B1 | 10/2002 | Olgaard et al. | |
| 6,538,588 B1 | 3/2003 | Bazarjani | |
| 6,567,025 B2 * | 5/2003 | Schreier et al. ............. | 341/143 |
| 6,590,619 B1 * | 7/2003 | Kawano ..................... | 348/738 |
| 7,061,416 B2 * | 6/2006 | Nagai ......................... | 341/143 |
| 7,148,829 B2 * | 12/2006 | Inukai ........................ | 341/139 |
| 7,358,879 B2 * | 4/2008 | Schreier et al. ............. | 341/143 |
| 7,362,178 B2 * | 4/2008 | Montemayor et al. ....... | 330/284 |
| 7,408,489 B2 * | 8/2008 | Delanghe et al. ............ | 341/118 |
| 2001/0006542 A1* | 7/2001 | Ozeki et al. ................. | 375/345 |
| 2006/0055579 A1* | 3/2006 | Fontaine et al. ............. | 341/155 |
| 2006/0092059 A1* | 5/2006 | Guimaraes .................. | 341/143 |
| 2007/0290756 A1* | 12/2007 | Lin et al. .................... | 330/278 |

* cited by examiner

Primary Examiner—Peguy JeanPierre

(57) ABSTRACT

A signal processing circuit has an analog to digital converter (31) for providing a digital signal to a processor (15) from an analog input signal that is susceptible to variations in signal power, e.g. from a radio front end (12). The device has a variable gain amplifier (13) controlled by a gain control signal based on detected signal strength. The analog to digital converter has a loop comprising a loop filter for processing the input signal. A signal strength detection circuit (32) is provided for generating the gain control signal, which signal strength detection circuit has loop signal detector for detecting the signal strength from the loop. Hence a received signal strength indicator RSSI is directly coupled to the analog to digital converter (31), avoiding the delay of signal strength detection in the digital processor.

12 Claims, 7 Drawing Sheets

Figure 1:
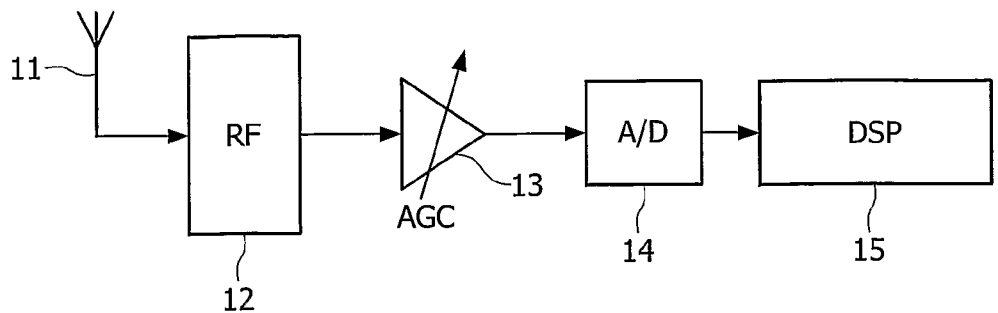

SIGNAL PROCESSOR WITH A SIGNAL STRENGTH DETECTION CIRCUIT THAT IS COUPLED TO A LOOP OF AN ANALOG TO DIGITAL CONVERTER

The invention relates to a device for digitally processing an analog input signal that is susceptible to variations in signal power.

The invention further relates to a mobile communication device comprising the device for digitally processing the analog input signal.

The invention relates to the field of analog to digital conversion for digital signal processing, and in particular to providing a signal strength indicator for automatic gain control.

The document U.S. Pat. No. 6,538,588 describes an analog to digital (A/D) converter, in particular a converter of a sigma-delta ($\Sigma\Delta$) type in a digital communications receiver device. In such a communications system an analog input signal that is susceptible to variations in signal power comprises an information signal component to be isolated from further signal components. The analog input signal is coupled to an input summing node of the A/D converter. The A/D converter has at least one loop that loops a generated digital output signal back to the input summing node, the loop including a loop filter coupled to a quantizer that provides the output signal. A required dynamic range at the input of the A/D converter is achieved by a preceding amplifier stage having a variable gain that is controlled by a gain control signal. A power detector is used to detect the power level of the analog input signal for generating the gain control signal. For example an analog power detector may be used at the input signal or, as further described in U.S. Pat. No. 5,107,225, a power level of a desired signal element in the input signal may be digitally measured after digital signal processing to remove undesirable images and spurious signals. Also the dynamic range of the $\Sigma\Delta$ A/D converter may be set in dependence of the operating mode of the receiver device. However, the known ways of detecting the power level for controlling the gain are not sufficiently quick and accurate, and may require additional circuitry. In particular detecting the power of the desired signal after digital processing may be accurate, but does not respond quickly to variations in the power level due to the substantial delay caused by the digital processing.

It is an object of the invention to provide a device for digitally processing an analog input signal having a signal strength detector that does not require complex circuits and responds quickly to variations in power level.

For this purpose, according to a first aspect of the invention the device for digitally processing an analog input signal as described in the opening paragraph comprises an amplifier having a variable gain in dependence of a gain control signal for generating an amplified signal from the input signal, an analog to digital converter for converting the amplified signal to a digital signal to be processed, the analog to digital converter including a loop comprising a loop filter, and a signal strength detection circuit for generating the gain control signal, the signal strength detection circuit comprising loop detection means for detecting the signal strength from the loop.

For this purpose, according to a second aspect of the invention the mobile communication device as described in the opening paragraph comprises the above device for digitally processing an analog input signal and a receiving unit for providing the analog input signal.

It is noted that the variable gain of the amplifier may be larger or smaller than unity, i.e. the amplified signal may be larger or smaller than the input signal. The measures have the effect that the analog input signal is conditioned in the analog domain by the amplifier based on the gain control signal from the signal strength detection circuit. The signal strength detection circuit is coupled to the loop, and therefore responds without delay to the power level of the input signal, as the loop is directly coupled to the input signal. Moreover, the loop detection means accurately detect overload of the analog to digital converter due to the fact that the loop responds in a predictable and detectable way on excess power levels of the input signal. Hence advantageously the signal strength detection circuit not delayed by the digital processing, and is not complex due to the direct coupling to the loop elements which are required anyway, which for example reduces the amount of chip area required for integration.

The invention is also based on the following recognition. In the known solutions the signals are commonly either manipulated in the analog domain as a preparatory step or finally analyzed in the digital domain by digital signal processing after conversion. In particular the skilled man will implement the transition from the analog domain to the digital domain as soon as possible after receiving analog input signals, and will implement the power detection in either one of the domains. However, the inventor has seen that the detection of the power level or signal strength is particularly well suited at the transition point itself, i.e. coupled to the loop inside the analog digital converter, because at the loop the effects of a too strong input signal are immediately detectable, e.g. by approaching of a clipping level of one or more loop elements.

In an embodiment of the device the loop detection means comprises at least one level detector coupled to the loop filter. This has the advantage that at the loop filter a signal level at a particular loop filter element that approaches a clipping level due to too high signal strength is easily detectible.

In an embodiment of the device the loop filter comprises a sequence of loop units and the loop detection means comprises a multitude of level detectors coupled to the sequence of loop units. In particular the loop detection means may comprise a logical output circuit for generating the gain control signal in dependence of a combination of output signals of the level detectors. This has the advantage that effects due to too high input signal strength are detected at a number of the loop units, and hence an accurate detection of overload of the analog to digital converter is achieved for various types of input signals, e.g. in particular frequency ranges.

In an embodiment of the device the logical output circuit comprises different weighing factors for the output signals of the level detectors, the weighing factors being selected based on an expected amount of degradation of the digital output signal due to a corresponding loop unit exceeding a level as detected by the respective level detector. This has the advantage that a gain control signal value is generated taking into account the amount of degradation of the performance of the analog to digital converter, e.g. by allowing some overload if only a few of the loop units are exceeding the levels.

Further preferred embodiments of devices according to the invention are given in the appended claims, disclosure of which is incorporated herein by reference.

Figure 2:
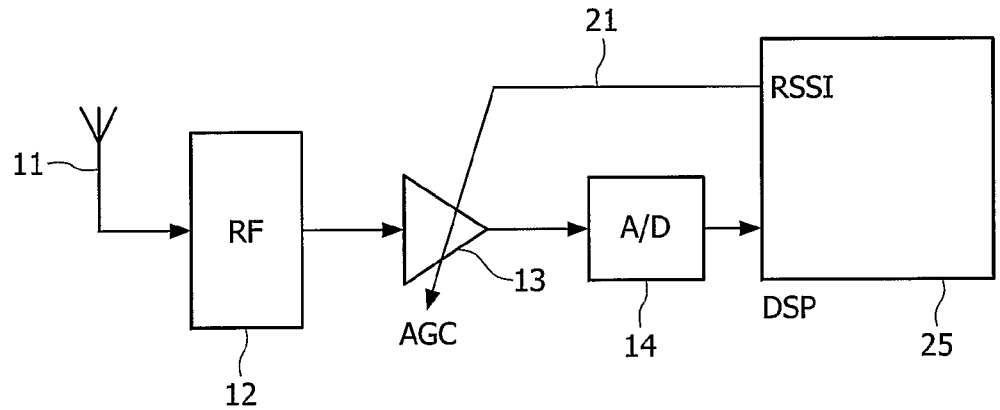
Figure 3:
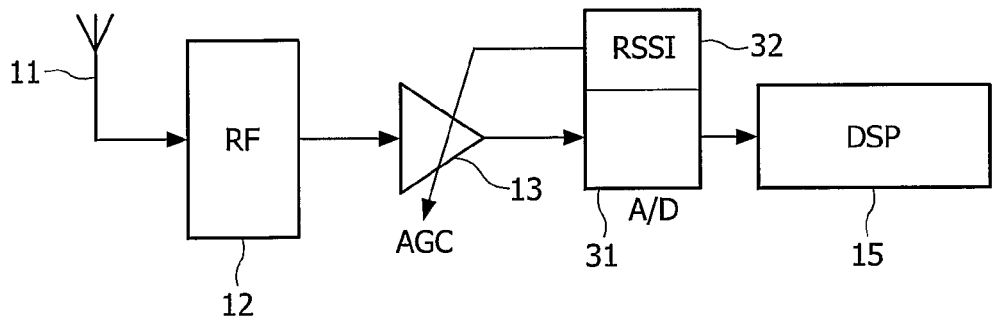
Figure 4:
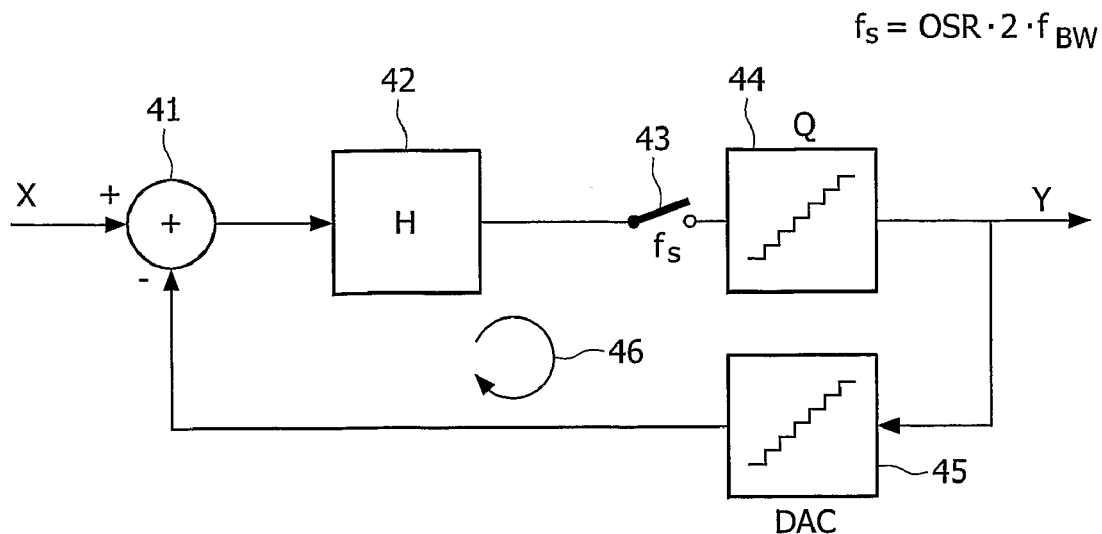
Figure 5:
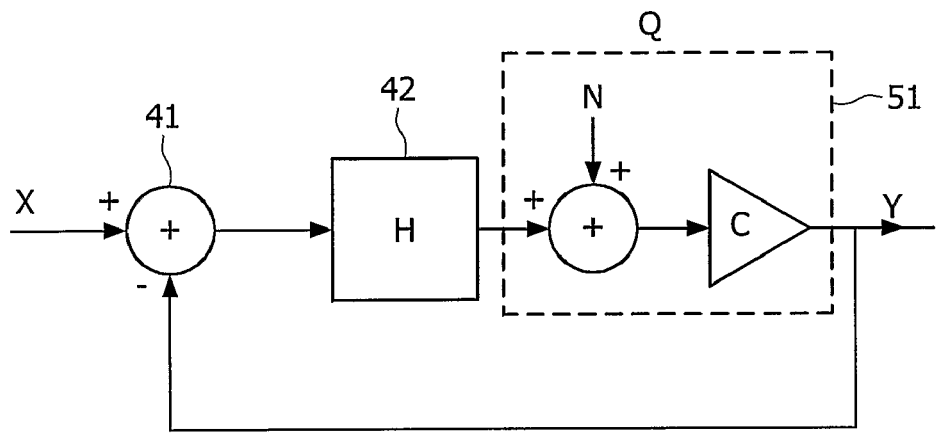
Figure 6:
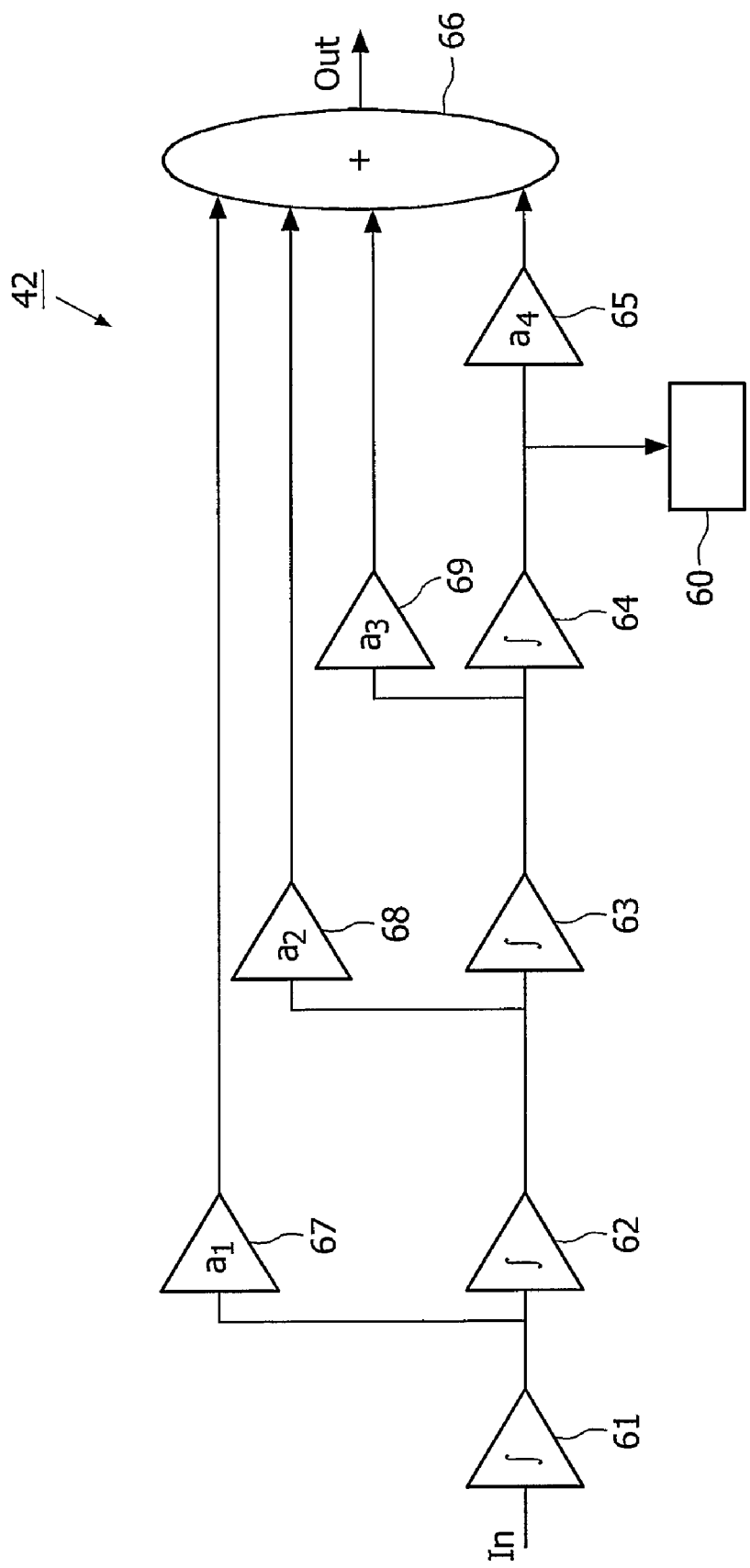
Figure 7:
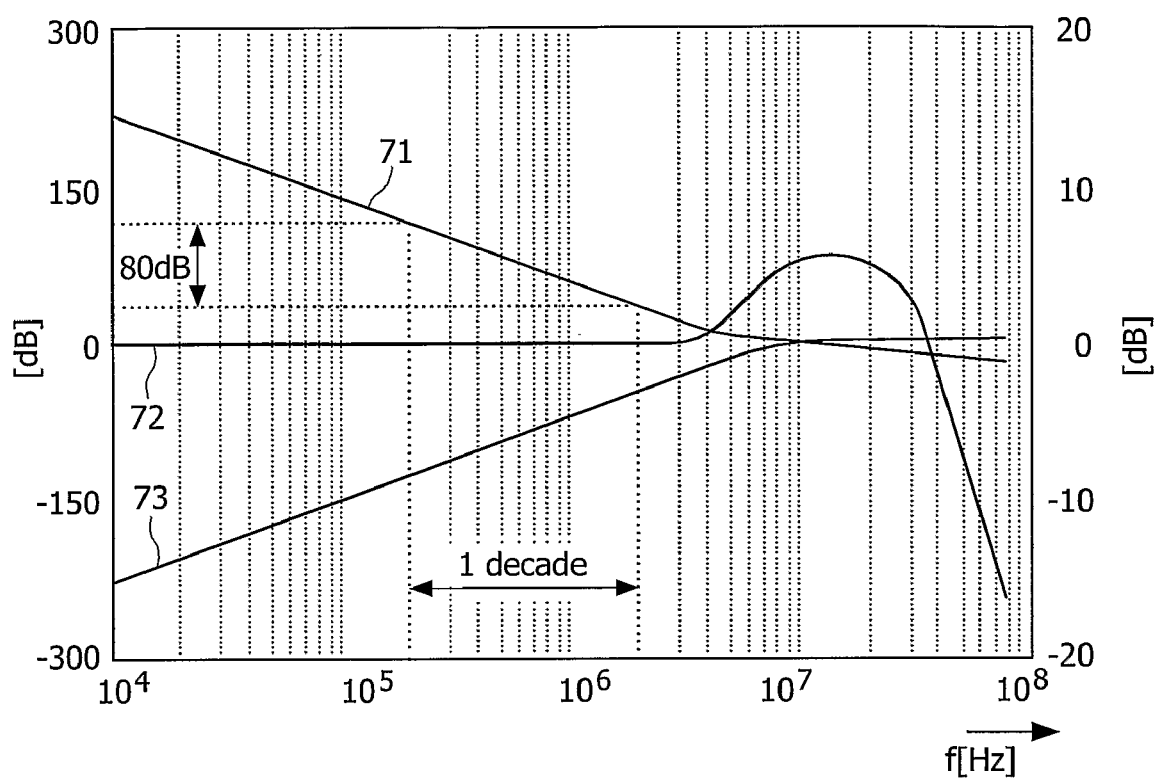
Figure 8:
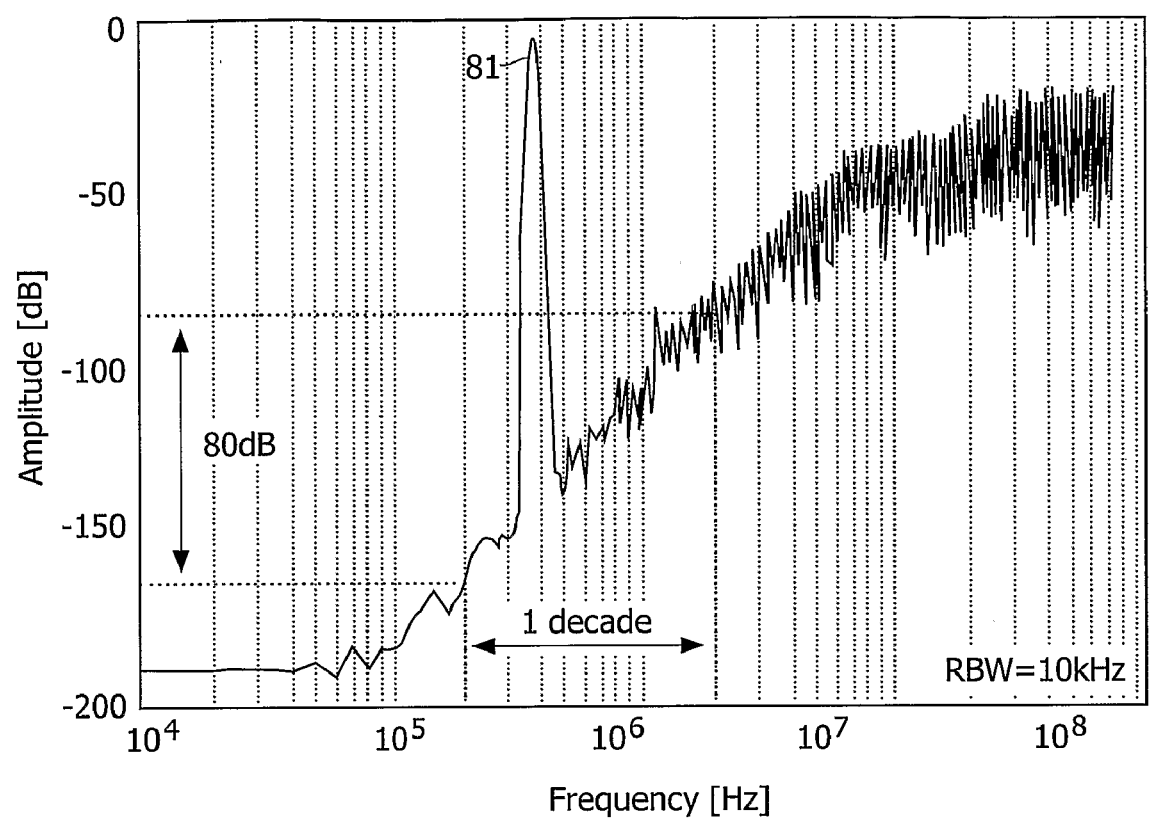
Figure 9:
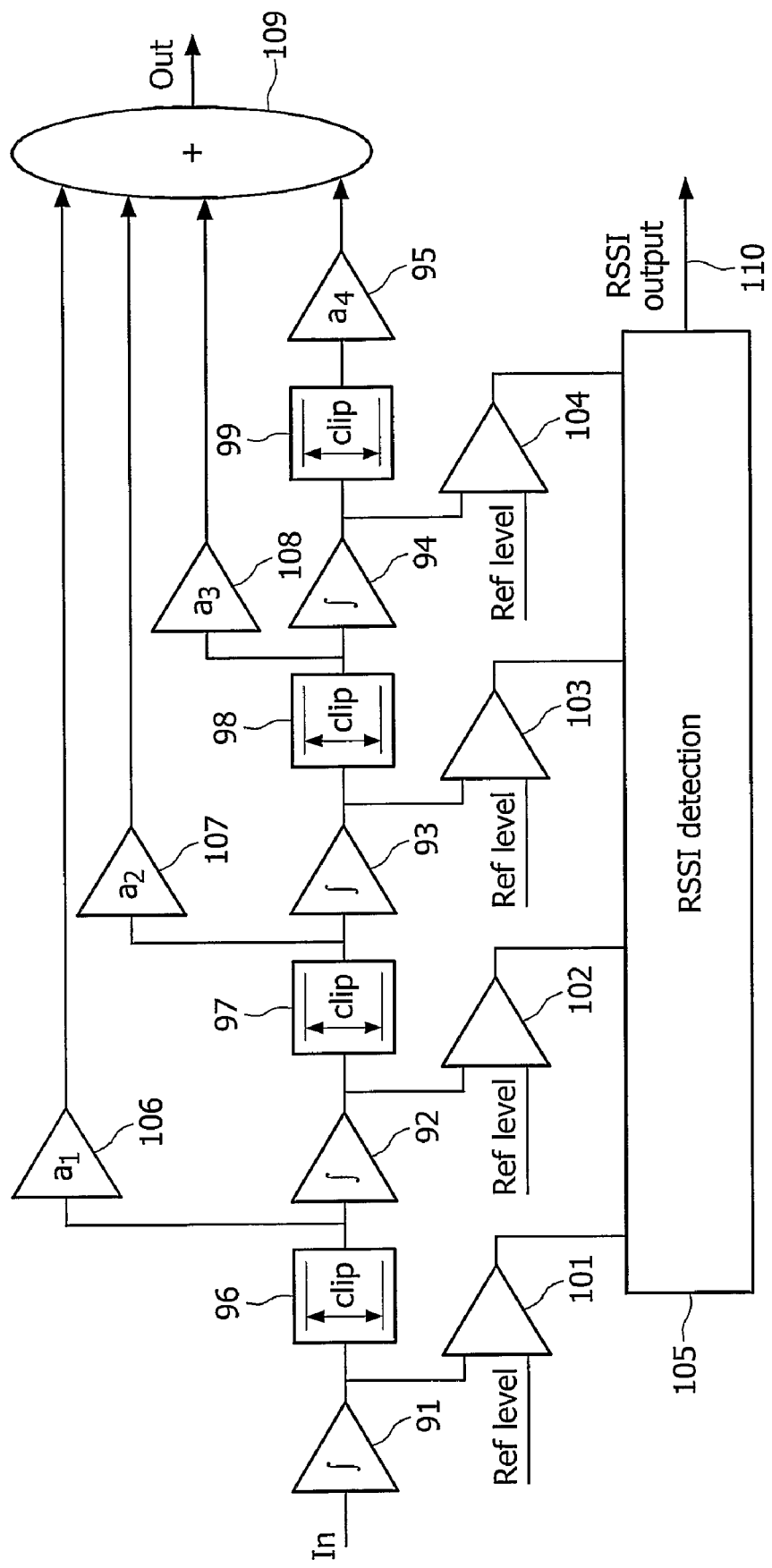
Figure 10:
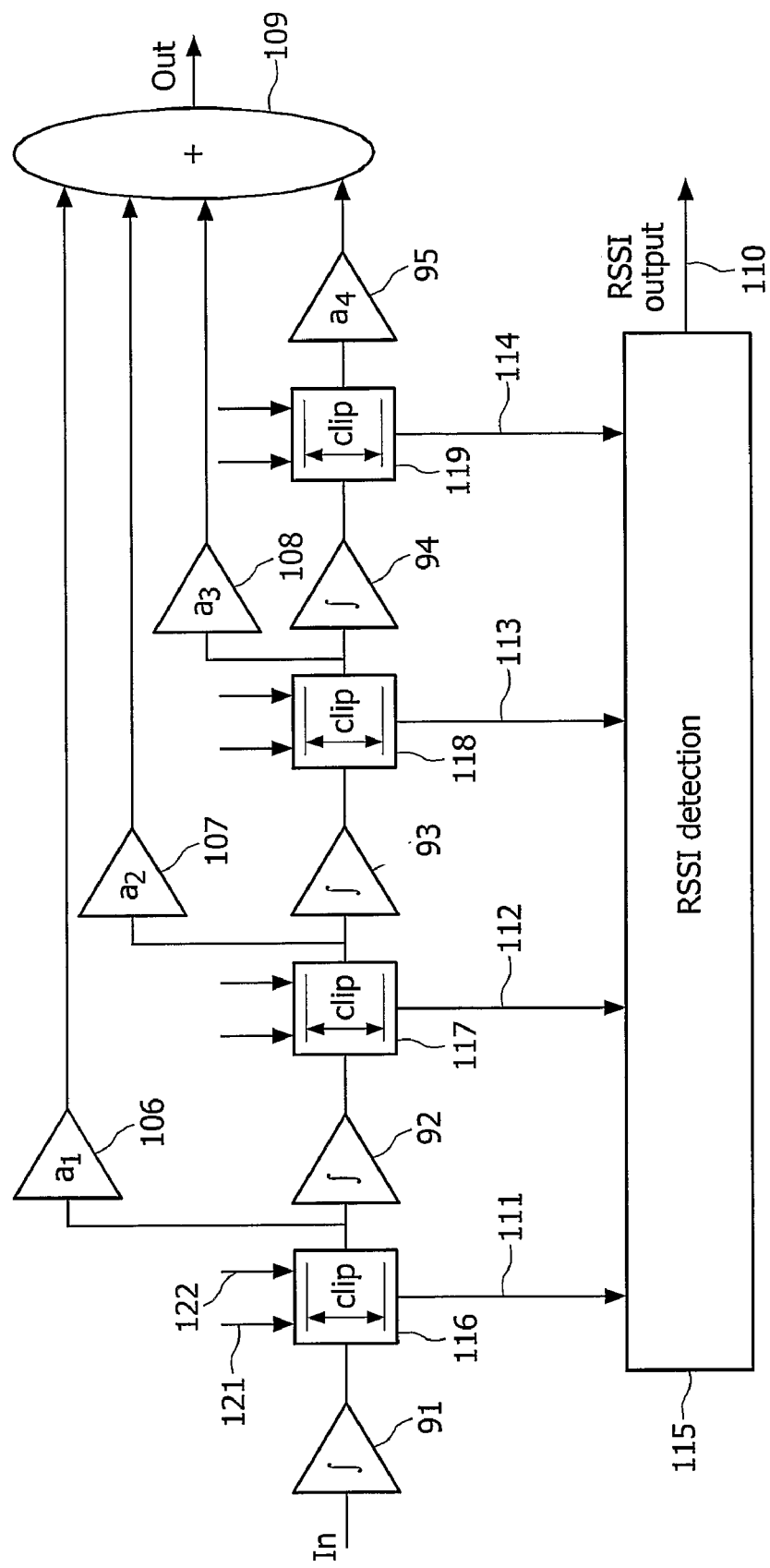

These and other aspects of the invention will be apparent from and elucidated further with reference to the embodiments described by way of example in the following description and with reference to the accompanying drawings, in which FIG. 1 shows a diagram of a prior-art receiver device, FIG. 2 shows a diagram of a prior-art receiver device having a signal strength detector in the digital signal processor, FIG. 3 shows a signal strength detector at the analog to digital converter, FIG. 4 shows a sigma-delta analog to digital converter, FIG. 5 shows a detailed model of a sigma-delta analog to digital converter, FIG. 6 shows a loop filter for use in an analog to digital converter, FIG. 7 shows a transfer function of a loop filter, FIG. 8 shows a spectrum of a converted input signal, FIG. 9 shows a detailed implementation of the loop filter and signal strength detector, and FIG. 10 shows a second detailed implementation of the loop filter and signal strength detector.

Corresponding elements in different Figures have identical reference numerals.

FIG. 1 shows a diagram of a prior-art receiver device. The device has an antenna 11 coupled to a radio frequency front end 12. The analog signal from the front end 12 is coupled to an amplifier 13 having an automatic gain control, e.g. by measuring the signal power in an analog signal strength detector circuit at the output of the amplifier 13. The amplifier provides the amplified analog signal to an analog to digital converter 14 (ADC), which provides a digital signal to the digital signal processor 15. In such digitized receiver architectures the A/D converter is present somewhere in the receiver chain to convert the information signal of a wanted channel into the digital domain. This digitization leads to more flexible receiver architecture, e.g. channel filtering and demodulation can be done in the digital domain. The RF front-end 12 in the Figure converts received radio signal including the wanted channel to an IF frequency (which may be zero), and also does preparatory signal conditioning such as amplification and channel filtering to attenuate neighboring channels and interferers. If the signal strength of the wanted channel is only small or too big, the AGC amplifier 13 is used to amplify or attenuate the incoming signal to condition it in such a way it can be converted into the digital domain properly. This means that the wanted signal is put as close as possible at the maximum input level of the ADC, causing the noise contribution of the ADC to be as low as possible. The problem is how to set the AGC. A way of setting the AGC is to measure the input power of the ADC in an analog way. An advantage of this topology is that it is fast because the input power is measured in front of the ADC. This topology also has a big disadvantage: it needs complicated analog circuitry.

FIG. 2 shows a diagram of a prior-art receiver device having a signal strength detector in the digital signal processor. The device has similar basic elements as in FIG. 1, e.g. the antenna 11, the front end 12, and the analog to digital converter 14. The amplifier 13 now has an automatic gain control input to be controlled by a control signal generated by the received signal strength indicator (RSSI) in a digital signal processor 25. Hence the digital processor has an RSSI output signal 21. In the digital processor 25 the output power of the ADC is measured and the RSSI output signal is created which indicates if the input signal of the ADC is too large or not. This type of AGC arrangement is slow, due to the fact that the signal has to pass the ADC and digital processing first, to be able to detect if the input signal to the ADC is too small or too large.

FIG. 3 shows a signal strength detector at the analog to digital converter. The device has similar basic elements as in FIG. 1, e.g. the antenna 11, the front end 12, and the amplifier 13 having the automatic gain control input to be controlled by a control signal generated by a signal strength detector 32 (RSSI) coupled to the analog to digital converter 31. It is noted that the amplifier has a variable gain in dependence of the gain control signal for generating an amplified signal from the input signal. The analog to digital converter is for converting the amplified signal to a digital signal to be processed further in the digital signal processor 15. The analog to digital converter includes a loop comprising a loop filter, the loop filter being dimensioned for achieving a desired noise characteristic and transfer function of the analog input signal to the digital output signal. Embodiments of the ADC are described below. The signal strength detection circuit 32 is for generating the gain control signal. The signal strength detection circuit includes detector circuits for detecting the signal strength from the loop. Hence, according to the invention, a novel way of providing a control signal to set the AGC is to integrate the signal strength detector in the ADC and detect the signal strength from signal levels at the internal loop in the ADC. In receiver architectures for mobile communication often a Sigma Delta Modulator is used to do the analog to digital conversion.

FIG. 4 shows a sigma-delta analog to digital converter. The sigma delta converter includes a loop filter 42 having a transfer function H, a quantizer Q after a sample unit 43 that samples the analog signal at sample frequency $f_s$ to provide an output signal Y. The sample frequency is set by:
$f_s = OSR \cdot 2 \cdot f_{BW}$ wherein OSR indicates output sample rate and $f_{BW}$ indicates the required bandwidth. The loop provides feedback via a digital to analog converter (DAC) 45 and a summing node 41 receiving an input signal X and a feedback signal from the loop via DAC 45. The sigma delta modulator provides noise shaping to suppress quantization noise in the signal bandwidth, while leaving the input signal unharmed, as shown below in FIG. 8.

FIG. 5 shows a detailed model of a sigma-delta analog to digital converter. Like in FIG. 4 an input node 41 and a loop filter 42 are provided, while feedback of the digital output signal Y to the input node 41 is shown by a direct connection. A model of a quantizer Q 51 is given in detail as a noise source N and a gain factor C. The output Y is subsequently defined by:

$$Y = \frac{C \cdot H}{1 + C \cdot H} X + \frac{C}{1 + C \cdot H} N$$

It is noted that, if C.H is sufficiently high, the output signal Y equal the input signal X and an additional noise component shaped by 1/H, i.e. by the loop filter as shown by a specific example in FIGS. 6 and 7.

FIG. 6 shows a loop filter for use in an analog to digital converter. The loop filter comprises a sequence of loop units, i.e. integrator units 61,62,63,64 connected in series. The output of each integrator unit is coupled via a respective amplifying unit 67,68,69,65 to a sum unit 66. The amplifying coefficient of each amplifying unit 67,68,69,65 is indicated by $a_1$, $a_2$, $a_3$, $a_4$ respectively. At least one detector unit 60 is coupled to the loop filter units, e.g. to the output of the last integrator unit 64. For example the level detector 60 may comprise a comparator to detect if the signal level exceeds a reference level. The level detector may further comprise a low pas filter or more specific filters or rules to allow short overload of the ADC before actually outputting the gain control signal to decrease the gain before the ADC. Alternatively the loop detection circuit for detecting the signal strength includes a multitude of level detectors coupled to the sequence of loop units. The loop filter in this example is of the 4th order, and consists of integrators and feed forward coefficients as indicated. The number of integrators determines the order of the noise shaping. It is noted that other filters may be used also, e.g. band-pass filters or more complex filter architectures.

In an embodiment of the above low pass filter the feed forward coefficients are calculated to make sure that the transfer function is first order at high frequencies to ensure loop stability. The integrators may be provided with predefined clip levels to make sure that if the ADC is overdriven, the output signals on the integrators are limited to an upper and lower level. This is to avoid large signal instability of the sigma delta modulator.

FIG. 7 shows a transfer function of a loop filter. The loop filter transfer function is indicated by the upper curve 71 having a clear low pass character, the horizontal axis indicating frequency and the vertical axis indicating the response (gain in dB indicated on the left vertical axis). The fourth order of the loop filter corresponds to the gain difference of 80 dB for a decade as shown in the Figure. A signal transfer function STF is indicated by a curve 72, and based on:

$$STF_{cl} = \frac{Y}{X} = \frac{C \cdot H}{1 + C \cdot H}$$

The noise shaping transfer function NTF is indicated by curve 73, and based on:

$$NTF_{cl} = \frac{Y}{N} = \frac{C}{1 + C \cdot H}$$

As can be seen from the Figure the sigma delta modulator uses noise shaping to suppress quantization noise in the signal bandwidth, while leaving the input signal unharmed.

FIG. 8 shows a spectrum of a converted input signal. The horizontal axis indicates frequency and the vertical axis indicates the response of an analog digital converter. The bandwidth (RBW) used for the spectrum is 10 kHz. The noise shaping as described above for an input signal containing a desired information channel is shown by the converted input signal curve 81. Again the noise shaping of a fourth order loop filter is visible from the gain difference of 80 dB for a decade.

FIG. 9 shows a detailed implementation of the loop filter and signal strength detector. A sum unit 109 receives the output signals of a sequence of integrators 91,92,93,94 via feed forward coefficients 106,107,108,95. Each integrator has a predefined clip level unit 96,97,98,99 connected to its output to provide a defined maximum signal level called clipping level to the next unit. The output of each integrator is also coupled to a respective comparator circuit 101,102,103, 104, to be compared to a respective reference level. It is noted that comparing to a single reference level may be sufficient for substantially symmetrical signal. For asymmetrical signals positive and negative levels may be detected separately as shown in FIG. 10, or the output signals of the integrators may be rectified before comparing to an absolute value signal. The output signals of the comparator circuits 101,102,103, 104 are combined in a logical detection circuit 105 to generate a RSSI output signal for controlling a gain of an amplifier in an automatic gain control setup. Obviously the RSSI signal may also be used for other purposes, e.g. to control a display unit to show a received signal strength to a user.

In an embodiment the signal strength indicator in the A/D converter has a comparator added to each integrator output which compares the integrator output signal to a reference level. The reference level is chosen in such a way that the sigma delta modulator has not started to clip yet. If the integrator output level exceeds the reference level an RSSI bit is set. The number of bits set by the different comparators indicates how severe the ADC is overdriven. The RSSI output can be formed by combining the bits set in a sensible way. The RSSI output bit is used to set the AGC and avoid ADC overload. The combination of the comparator bits may be done by a simple AND gate. When the output of the AND gate is a logic "1", this means that the ADC is likely to be overdriven. In a more complex embodiment the bits are combined in a weighted way. This is advantageous if the sigma delta converter coefficients are designed in such a way that if the sigma delta converter is overdriven, the last integrator is clipping first, the second last integrator is clipping second, and so on. In this way the ADC gracefully degrades in performance, because if a stage starts clipping, it distorts the internal signals of the sigma delta modulator. The degradation in performance of the sigma delta modulator as a whole is modest when only the 4th integrator is clipping and much worse if also the first integrator is clipping. This is because the 4th integrator is at the end of the loop filter, which means that there is a lot of gain in front of the 4th integrator. The errors made here are shaped (like the quantization noise) by the part of the loop filter which is still working properly (i.e. is not yet clipping). By using weighted RSSI bits, the RSSI information coming from the first integrator can be made more important compared to the RSSI information coming from the 4th integrator.

FIG. 10 shows a second detailed implementation of the loop filter and signal strength detector. Like in FIG. 9 a sum unit 109 receives the output signals of a sequence of integrators 91,92,93,94 via feed forward coefficients 106,107,108, 95. Each integrator has a clip level detector 116,117,118,119 connected to its output to provide an output signal having a defined maximum signal level to the next unit. Each clip level detector has a negative reference level input 121 and a positive reference level input 122, which may be set to a fixed value or may be adjusted by a control unit. It is to be noted that noise like disturbances may be asymmetrical, e.g. only exceeding the negative reference level. Advantageously the clip level detectors having dual reference levels are responsive to such asymmetrical signals. The clip level detectors produce output signals 111,112,113,114 that indicate whether the actual signal level exceeds the negative reference level or the positive reference level, e.g. a one bit digital signal having value 1 if any clipping occurs, or a multi bit value indicating the status of both reference levels. The output signals of the clip level detectors 116,117,118,119 are combined in a logical detection circuit 115 to generate a RSSI output signal 110 for controlling a gain of an amplifier in an automatic gain control setup It is to be noted that the methods described above also work for devices having other ADC topologies such as band pass sigma delta modulators, Nyquist converters and so on. The digital output signal of the detector circuit can be monitored in a smart way and can be used to set AGC to the right value, for example regular high but short peak levels of disturbance may be ignored being classified as unavoidable.

Although the invention has been explained mainly by embodiments based on sigma delta type analog to digital converters having loop filters, it is noted that in the invention may be implemented using any type of analog to digital converter having some internal loop or amplifying elements, which do respond in a predictable way on too high or too low signal levels. Further it is noted, that in this document the word 'comprising' does not exclude the presence of other elements or steps than those listed and the word 'a' or 'an' preceding an element does not exclude the presence of a plurality of such elements, that any reference signs do not limit the scope of the claims, that the invention may be implemented by means of both hardware and software, and that several 'means' may be represented by the same item of hardware. Further, the scope of the invention is not limited to the embodiments, and the invention lies in each and every novel feature or combination of features described above.

The invention claimed is:

1. Device for digitally processing an analog input signal that is susceptible to variations in signal power, the device comprising
    an amplifier having a variable gain in dependence of a gain control signal for generating an amplified signal from the input signal,
    an analog to digital converter for converting the amplified signal to a digital signal to be processed, the analog to digital converter including a loop comprising a loop filter, and
    a signal strength detection circuit for generating the gain control signal, the signal strength detection circuit being coupled to the loop of the analog to digital converter and comprising loop detection means for detecting the signal strength from the loop.

2. Device as claimed in claim 1, wherein the loop detection means comprises at least one level detector coupled to the loop filter.

3. Device as claimed in claim 2, wherein the loop filter comprises a sequence of loop units and the loop detection means comprises a multitude of level detectors coupled to the sequence of loop units.

4. Device as claimed in claim 3, wherein the loop detection means comprise a logical output circuit for generating the gain control signal in dependence of a combination of output signals of the level detectors.

5. Device as claimed in claim 4, wherein the logical output circuit comprises different weighing factors for the output signals of the level detectors, the weighing factors being selected based on an expected amount of degradation of the digital output signal due to a corresponding loop unit exceeding a level as detected by the respective level detector.

6. Device as claimed in claim 3, wherein the sequence of loop units comprises integrators and feed forward units.

7. Device as claimed in claim 1, wherein the analog to digital converter is a sigma-delta converter and the loop comprises an analog loop filter coupled to a quantizer.

8. Device as claimed in claim 1, wherein the loop detection means comprise level detectors arranged for detecting a loop signal level at a reference level below a clipping level of a preceding loop unit.

9. Mobile communication device, the device comprising a device for digitally processing an analog input signal as claimed in claim 1, and a receiving unit for providing the analog input signal.

10. The device as claimed in claim 1, wherein the signal strength detection circuit is integrated with the analog to digital converter to detect the signal strength of the input signal at the loop of the analog to digital converter.

11. The device as claimed in claim 1, wherein the analog to digital converter is a sigma delta analog to digital converter that includes a sequence of loop units, wherein the loop detection means is coupled to the sequence of loop units.

12. The device as claimed in claim 11, wherein the loop detection means is coupled to the last one of the loop units in the sequence of loop units.

* * * * *